US009857855B2

(12) United States Patent
Kaplan

(10) Patent No.: US 9,857,855 B2
(45) Date of Patent: Jan. 2, 2018

(54) REDUNDANT SECONDARY POWER SUPPORT SYSTEM

(71) Applicant: Amazon Technologies, Inc., Reno, NV (US)

(72) Inventor: Faran Harold Kaplan, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 725 days.

(21) Appl. No.: 14/315,242

(22) Filed: Jun. 25, 2014

(65) Prior Publication Data
US 2015/0378408 A1 Dec. 31, 2015

(51) Int. Cl.
*G06F 1/26* (2006.01)
*H02J 9/06* (2006.01)
*H05K 7/14* (2006.01)

(52) U.S. Cl.
CPC ............... *G06F 1/263* (2013.01); *H02J 9/06* (2013.01); *H05K 7/1492* (2013.01)

(58) Field of Classification Search
CPC ............ G06F 1/263; H02J 9/06; H05K 7/1492
USPC ........................................................ 307/147
See application file for complete search history.

(56) References Cited

U.S. PATENT DOCUMENTS

| 7,459,803 | B2 | 12/2008 | Mosman | |
|---|---|---|---|---|
| 7,724,518 | B1 | 5/2010 | Carlson et al. | |
| 7,851,950 | B1 * | 12/2010 | Morales | H05K 7/1492 |
| | | | | 307/147 |
| 8,378,530 | B1 * | 2/2013 | Morales | H05K 7/1492 |
| | | | | 307/147 |
| 8,994,231 | B1 * | 3/2015 | Corhodzic | H01F 27/40 |
| | | | | 307/147 |
| 9,377,832 | B1 * | 6/2016 | Heydari Monfared | H05K 7/1457 |
| 2003/0196126 | A1 * | 10/2003 | Fung | G06F 1/3203 |
| | | | | 713/300 |

(Continued)

OTHER PUBLICATIONS

"Is-limiter; The World Fastest Limiting and Switching Device", ABB, downloaded Nov. 26, 2013, pp. 1-19.

(Continued)

*Primary Examiner* — Zeev V Kitov
*Assistant Examiner* — Brian K Baxter
(74) *Attorney, Agent, or Firm* — Robert C. Kowert; Meyertons, Hood, Kivlin, Kowert & Goetzel, P.C.

(57) ABSTRACT

A concurrently maintainable secondary power distribution system enables redundant secondary power support to electrical loads, which receive independent primary power support from separate primary power systems, via a secondary power busway. Separate bus ducts, each carrying power from a secondary power system, are coupled to opposite ends of the busway. Each bus duct can carry power from a separate secondary power system, and switching devices bridging the connections between the bus ducts and the power busway can selectively switch the power busway from one of the bus ducts to the other bus duct, thereby switching between one of the secondary power systems. The separate secondary power systems can be coupled together at various points in the respective power systems, so that one or more portions of one of the secondary power systems can distribute power received from an upstream portion of another one of the secondary power systems.

20 Claims, 7 Drawing Sheets

(56) References Cited

U.S. PATENT DOCUMENTS

| | | | | |
|---|---|---|---|---|
| 2006/0097578 A1* | 5/2006 | Baldwin | .................... | H02J 1/16 307/66 |
| 2011/0140523 A1* | 6/2011 | Ziegler | .................... | H02J 9/062 307/44 |
| 2011/0148213 A1* | 6/2011 | Baldwin | ................ | H02J 1/102 307/82 |
| 2011/0240497 A1* | 10/2011 | Dechene | .................... | E04H 5/02 206/320 |
| 2011/0304211 A1 | 12/2011 | Peterson et al. | | |
| 2012/0074794 A1* | 3/2012 | Morales | .................... | G06F 1/26 307/147 |
| 2012/0092811 A1* | 4/2012 | Chapel | .................... | H04L 12/10 361/622 |
| 2012/0181869 A1* | 7/2012 | Chapel | .................... | H02J 9/06 307/64 |
| 2012/0200987 A1* | 8/2012 | Schmitt | ................ | H05K 7/1492 361/624 |
| 2013/0163193 A1* | 6/2013 | Ballantine | .......... | H05K 7/20763 361/679.47 |
| 2013/0253861 A1 | 9/2013 | Nicholson et al. | | |
| 2013/0293017 A1* | 11/2013 | Englert | .................... | H02J 9/04 307/65 |
| 2015/0036266 A1* | 2/2015 | Emert | .................... | H05K 7/026 361/624 |
| 2015/0129301 A1* | 5/2015 | Bailey | .................... | G06F 1/189 174/70 B |
| 2015/0245531 A1* | 8/2015 | Meinecke | ............ | H02M 3/158 361/679.02 |
| 2015/0331467 A1* | 11/2015 | Kaplan | .................... | G06F 1/30 713/300 |
| 2015/0357798 A1* | 12/2015 | Loeffler | .................... | H02B 1/20 361/624 |
| 2016/0105988 A1* | 4/2016 | Englert | ................ | H05K 7/1457 361/679.02 |
| 2016/0195911 A1* | 7/2016 | Chapel | ................ | G06F 1/3287 713/340 |

OTHER PUBLICATIONS

"Electrical Switch Definitions" Morpac Industries, downloaded Mar. 3, 2014, pp. 1-7.

"Is-Limiter" ABB, Oct. 13, 2011, pp. 1-26.

International Search Report and Written Opinion from PCT/US2015/037387, Amazon Technologies, Inc., dated Oct. 23, 2015, pp. 1-10.

* cited by examiner

REDUNDANT SECONDARY POWER SUPPORT SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), lay cables, install racks, enclosures, and cooling systems to implement waste heat removal therefrom. Additional time and resources are typically needed to conduct inspections and obtain certifications and approvals, such as for electrical and HVAC systems.

Some data centers have no redundancy at the PDU level. Such data centers may have a large affected zone when a UPS or PDU failure in the power system occurs. In addition, some data centers have "single threaded" distribution via the electrical supply to the floor, and in which maintenance can only be performed when the components are shut-off. The down-time associated with maintenance and reconfiguration of primary power systems in a data center may result in a significant loss in computing resources. In some critical systems such as hospital equipment and security systems, down-time may result in significant disruption and, in some cases, adversely affect health and safety.

Some systems include dual power systems that provide redundant power support for computing equipment. In some systems, an automatic transfer switch ("ATS") provides switching from a primary power system to a secondary (e.g., back-up) power system. In a typical system, the automatic transfer switch automatically switches a computing rack to the secondary system upon detecting a fault in the primary power. To maintain the computing equipment in continuous operation, the automatic transfer switch may need to make the transfer to secondary power system rapidly (for example, within about 16 milliseconds).

Some data centers include back-up components and systems to provide back-up power to servers in the event of a failure of components or systems in a primary power system. In some data centers, a primary power system may have its own back-up system that is fully redundant at all levels of the power system. Such a level of redundancy for the systems and components supported by the primary and fully-redundant back-up system may be referred to as "2N" redundancy. For example, in a data center having multiple server rooms, one or more server racks may receive power support from a primary power system and fully-redundant back-up power system. The back-up system for each server room may have a switchboard, uninterruptible power supply (UPS), and floor power distribution unit (PDU) that mirrors a corresponding switchboard, uninterruptible power supply, and floor power distribution unit in the primary power system for that server room. Providing full redundancy of the primary power systems may, however, be very costly both in terms of capital costs (in that in may require a large number of expensive switchboard, UPSs, and PDUs, for example) and in terms of costs of operation and maintenance. In addition, with respect to the primary computer systems, special procedures may be required to switch components from the primary system to a back-up system to ensure uninterrupted power supply for the servers, further increasing maintenance costs. As a result, some data centers may include a back-up system that is less than fully redundant for a primary power system. Such a level of redundancy for the systems and components supported by the primary and fully-redundant back-up system may be referred to as "N+1" redundancy. While N+1 redundancy may not provide fully-redundant reserve power support for computing equipment, such redundancy may involve lower capital and operating costs.

Some servers are coupled to one or more back-up components and systems via a dedicated power pathway, where the number of pathways coupling one or more servers to the one or more back-up components and systems is limited to a particular pathway. In addition, some back-up components and systems provide back-up power support to multiple servers. In both instances, servers may be vulnerable to loss of back-up power support from various causes, including faults in the dedicated power pathway between the servers and the back-up components and systems and faults in the back-up components and systems themselves. Furthermore, where a set of back-up components and systems provide back-up power support to multiple servers, those multiple servers may lose back-up power support due to one or more various faults related to the back-up components and systems, one or more pathways associated with such components and systems, etc. Furthermore, back-up power support for one or more servers may be lost if one or more back-up components and systems are taken off-line for maintenance. Mitigating such risks may be costly in terms of capital costs and in terms of costs of operation and maintenance (for example, performing additional maintenance on back-up components and systems to mitigate the risk of back-up power support loss due to faults in such components and systems).

Figure 1:
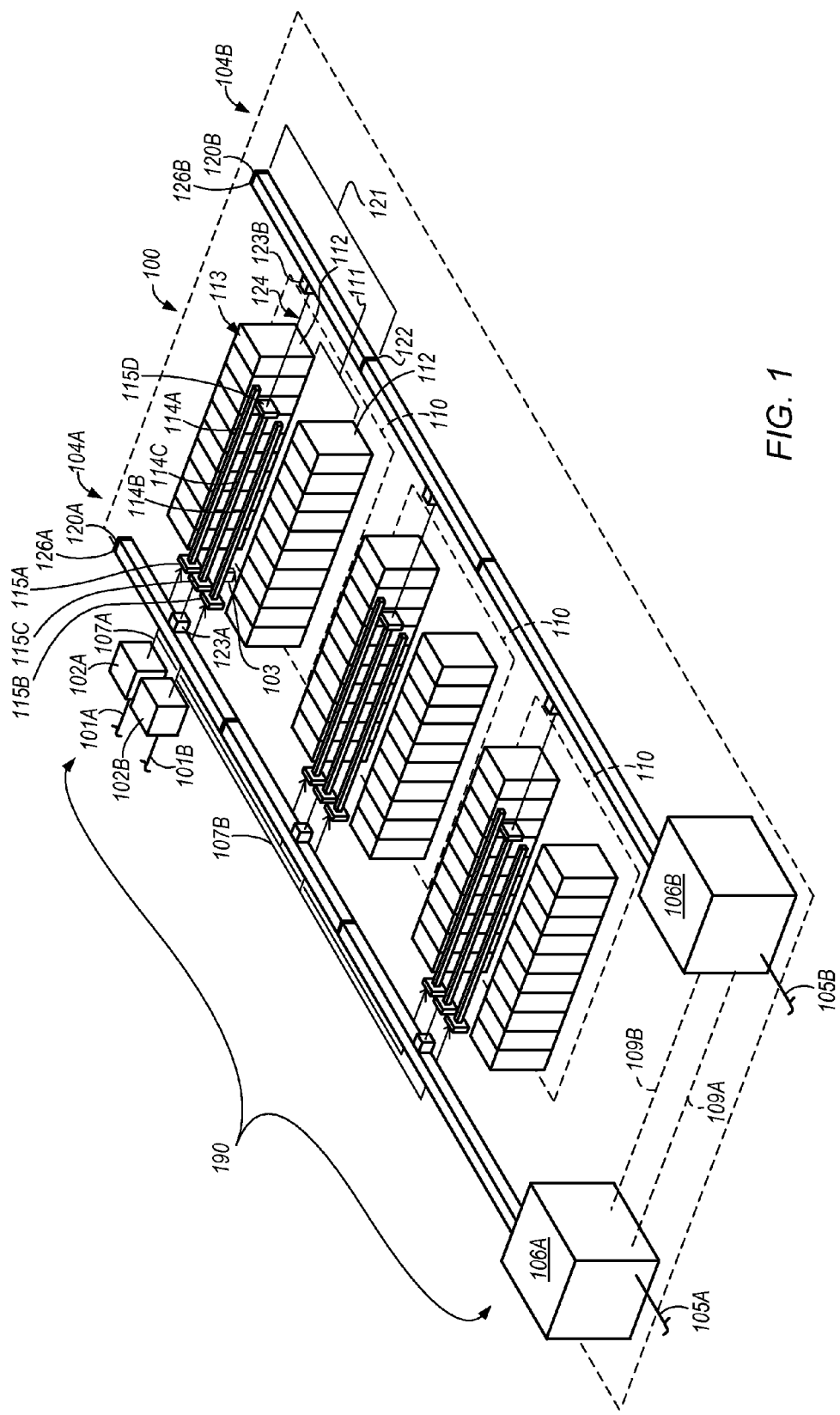
FIG. 1 is a schematic illustrating a perspective view of a data center including a redundant secondary power support system, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of power distribution systems for providing redundant power support to computer systems in a data center are disclosed. According to one embodiment, a data center includes an aisle space which provides computing capacity and separate bus ducts that each extend along opposite ends of the length of the aisle space and provide redundant secondary power support to the computing capacity. The aisle space includes a row of rack computer systems which extends along the length of the aisle space, two or more primary power busways which extends through the aisle space in parallel with the row of rack computer systems, and a secondary power busway which extends through the aisle space in parallel with the at least one row of rack computer systems. The primary power busways can distribute primary power, received at each of the at least two primary power busways from separate primary power systems, to the row of rack computer systems to provide primary power support to the rack computer systems. The secondary power busway includes separate feed boxes at opposite ends and can distribute secondary power, received in one of the feed boxes, to the rack computer systems. The separate bus ducts each can distribute secondary power from one or more secondary power systems to separate feed boxes of the secondary power busway to provide redundant secondary power support to the row of rack computer systems via the secondary power busway.

According to one embodiment, a system includes separate bus ducts which each provide redundant secondary power support from one or more secondary power systems to one or more sets of electrical loads located in one or more aisle spaces. Each of the electrical loads receives independent primary power support from separate primary power systems. To provide redundant secondary power support, the separate bus ducts each can couple with opposite ends of a secondary power busway which extends through the one or more aisle spaces. The secondary power busway can distribute electrical power from one or more of the bus ducts to the one or more sets of electrical loads.

According to one embodiment, a method includes configuring a power distribution system to provide primary power support and redundant secondary power support to electrical loads in a data center. Such configuration includes configuring a primary power busway and a secondary power busway to extend along a length of an aisle space that includes a row of electrical loads. Such configuration also includes configuring at least two separate bus ducts to each extend along opposite ends of the length of the aisle space and to each carry secondary power received from at least one secondary power system. Furthermore, such configuration includes configuring the secondary power busway to selectively distribute secondary power from a separate one of the at least two bus ducts to the electrical loads in response to primary power becoming unavailable for distribution to the electrical loads from the primary power busway. To do so, the secondary power busway is coupled, at separate opposite ends, to separate bus ducts.

As used herein, "computer room" means a room of a building in which computer systems, such as rack-mounted servers, are operated.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a secondary power system may provide secondary power support to an electrical load by providing a secondary power feed that can be selectively routed to the load by a switching device that is downstream of the secondary power system and upstream of the load, where the switching device may selectively route the secondary power feed or a primary power feed to the load based at least in part upon one or more conditions associated with the primary power feed.

As used herein, "power distribution unit", also referred to herein as a "PDU", means any device, module, component, or combination thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, "primary power" means any power that can be supplied to an electrical load, for example, during normal operating conditions. A power distribution system (also referred to herein as a "power system") that distributes primary power may be referred to as a primary power system.

As used herein, "secondary power", which can include one or more of "reserve power", "backup power", etc., means power that can be supplied to an electrical load upon the failure of, or as a substitute for, primary power to the load. A power distribution system (also referred to herein as a "power system") that distributes secondary power may be referred to as a secondary power system.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

In various embodiments, redundant secondary power support can be provided to electrical loads in a data center, where a power busway configured to provide secondary power support is configured to couple, at opposite ends of the busway, to separate bus ducts which each carry power from at least one secondary power system, where the power busway can provide power support via power received from a selected one of the separate bus ducts. The busway can be switched between bus ducts based at least upon switching operations of switching devices included in the connections between the separate bus ducts and the opposite ends of the busway, where the switching devices perform an open-transition switching operation to switch the busway between receiving power from separate bus ducts.

As used herein, a "bus duct" may refer to an enclosed module containing one or more bus bars for distribution of electrical power between components of a power distribution system. The enclosed module may be prefabricated and can include bus bars in a protective enclosure. In some embodiments, the terms "bus duct" and "busway" are used interchangeably.

In various embodiments, the bus ducts each carry power from a separate one of two or more separate secondary power systems. Each secondary power system can receive power from one or more separate power sources, including utility power, generator power, etc. Each secondary power system can include a separate utility transformer, generator, utility switchboard which can switch between various power feeds, including power from the utility transformer, generator, etc. Each secondary power system can include one or more uninterruptible power supplies (UPSs) which are downstream of the utility switch board and can receive and distribute power from the utility switchboard, distribute power in the absence of power from the utility switchboard, etc. Each secondary power system can include a distribution switchboard, located downstream of the UPSs of the secondary power system, where the distribution switchboard can distribute power received from at least the UPSs to one or more bus ducts.

In various embodiments, the separate secondary power systems are coupled, at the respective utility switchboards of the secondary power systems, by an upstream power connection which enables power from a utility switchboard of one secondary power system to be distributed to a utility switchboard of another secondary power system. Such upstream power connection can enable a secondary power system to distribute, from the local utility switchboard, power received from a power source of another separate secondary power system. For example, where a utility transformer of a secondary power system is to be de-energized, utility power from another utility transformer of another secondary power system can be distributed to the secondary power system via the upstream power connection, so that utility power from the other utility transformer is distributed from the utility switchboard of the secondary power system and the other utility switchboard of the other secondary power system. Thus, utility power from a utility transformer of one secondary power system can provide secondary power support to separate bus ducts.

In various embodiments, the separate secondary power systems are coupled, at the respective distribution switchboards of the secondary power systems, by a downstream power connection which enables power from a distribution switchboard of one secondary power system, which can be received from the UPS of that secondary power system, to be distributed to a distribution switchboard of another secondary power system. Such downstream power connection can enable a secondary power system to distribute, from the local distribution switchboard, power received from a UPS of another separate secondary power system. For example, where a UPS of a secondary power system is to be de-energized, fails, etc., power from another UPS of another secondary power system can be distributed to the secondary power system via the downstream power connection, so that power from the other UPS is distributed from the distribution switchboard of the secondary power system and the other utility switchboard of the other secondary power system. Thus, power from a UPS of one secondary power system can provide secondary power support to separate bus ducts.

FIG. 1 is a schematic illustrating a perspective view of a data center including a redundant secondary power support system, according to some embodiments.

Data center 100 includes multiple aisle spaces 110 which each provide computing capacity for the data center 100. Each aisle space 110 includes an aisle 111 and two rows 112 of rack computer systems 113 which extend along the length of the aisle 111 along opposite side ends of the aisle 111. Each rack computer system 113 can provide at least a portion of computing capacity of the aisle space 110 by performing computing operations. In the illustrated embodiment, each aisle space 110 in data center 100 is parallel, such that the respective aisles 111 of each of the aisle spaces 110 extend in parallel with each other along their respective lengths between opposite ends of the aisles 111. Furthermore, the rows 112 of rack computer systems 113 in the parallel aisle spaces 110 extend in parallel with each other.

Data center 100 includes a power distribution system 190 which provides power support to the various rack computer systems 113 in the data center 100. Power distribution system 190 includes primary power systems 102A-B and secondary power systems 106A-B. Each power system 102A-B, 106A-B can include various separate sets of power distribution components, including a utility transformer, generator, uninterruptible power supply ("UPS"), power distribution unit ("PDU"), etc. Each separate power system receives utility power from a separate utility power source.

Each aisle space 110 in data center 100 includes a set of power busways 114 which can provide power support to rack computer systems 113 in the aisle space. A set of power busways can include separate power busways which receive power from separate power systems and are electrically coupled to one or more components in the aisle space, so that the busways can distribute power to one or more rack computer systems 113 via the coupled components. In the illustrated embodiment, for example, aisle space 110 includes power busways 114A-C. The busways 114 extend through the aisle space 110, along the length of the aisle 111 between opposite ends of the aisle 111. Each busway 114A-C includes at least one feed box 115A-D which receives power which is carried by the respective busway and distributed to electrically coupled components in the aisle space 110 to provide power support to at least some of the rack computer systems 113 in the aisle space.

In some embodiments, separate portions of rack computer systems in one or more aisle spaces receive primary power support from separate busways which receive power from separate primary power systems. For example, in the illustrated embodiment, each aisle space 110 includes primary power busways 114A and 114B which extend along the aisle 111 of the aisle space 110 and respectively receive primary power from a separate primary power system of power systems 102A-B. In some embodiments, busway 114A is electrically coupled to one of the rows 112 of rack computer systems 113 on one side end of aisle 111, and busway 114B is electrically coupled another row 112 of rack computer systems 113 on the other side end of aisle 111. In some embodiments, a single primary power busway 114 extends through an aisle 111 and provides primary power support to each of the rack computer systems 113 in the aisle space 110 by electrically coupling with each of the rack computer systems 113. Each of the primary power busways 114A-B includes a separate feed box 115A-B at one end of the respective primary power busway. The respective feed boxes 115A-B are each electrically coupled to a separate primary power system 102A-B via respective separate power transmission lines 107A-B. The separate power transmission lines 107 can each at least partially comprise one or more busways, bus ducts, power cables, etc.

The feed boxes 115A-B may be located at a particular end of each of the primary power busways 114A-B that is proximate to a particular end of aisle 111. In the illustrated embodiment, for example, feed boxes 115A-B are located at respective ends of busways 114A-B which are proximate to an end of aisle 111 which is proximate to primary power systems 102A-B.

Primary power systems 102A-B each receive utility power from separate power sources 101A-B, respectively. Each primary power system 102A-B can distribute primary power to various rack computer systems 113 in the aisle spaces 110 via power transmission lines 107A-B, respectively. Each primary power system can include various separate sets of power distribution components, including a utility transformer, generator, UPS, power distribution unit (PDU), etc.

To electrically couple one or more of busways 114A-C with one or more rack computer systems 113 in aisle space 110, a tap box 103 can be coupled with a respective busway 114 and coupled, via a power cable extending from the tap box, to a component in one or more of the rows 112. The component can include one or more of a rack computer system 113, an intermediate component which distributes power from one or more power sources to one or more rack computer systems 113, etc. The intermediate component, in some embodiments, includes one or more of a power distribution unit (PDU), automatic transfer switch (ATS) which selectively distributes power from one or more busways to one or more downstream rack computers systems via one or more branch circuits, etc.

Busway 114C in a given aisle space 110 is a secondary power busway which provides secondary power support to the rack computer systems 113 included in the aisle space by carrying secondary power received from one or more secondary power systems. Secondary power support can be provided to a load via a tap box 103, coupled to the busway 114C, which is electrically coupled to one or more of the rack computer systems 113. Secondary power support is independent of primary power support to the rack computer systems 113 and includes providing power which can be distributed to the rack computer systems 113 in the aisle space 110 upon the failure of, or as a substitute for, primary power to the rack computer systems 113. For example, secondary power busway 114C and a primary power busway 114A can be electrically coupled, via respective coupled tap boxes and power cable connections, to an ATS located in one of the rows 112 and can selectively distribute power from one of the busways 114A, C to coupled rack computer systems 113 in the row 112 via branch circuits. Upon failure of power distribution from primary power busway 114A, which can include failure of the coupled primary power system 104, the ATS can switch from distributing power from busway 114A to distributing power from busway 114C.

Data center 100 includes separate bus ducts 120A-B which extend along separate sides 104A-B of the data center and each carry power from at least one of the secondary power systems 106A-B. In some embodiments, each one of the separate bus ducts 120A, B carries power received from a separate one of the secondary power systems 106A-B. For example, bus duct 120A can carry power received from secondary power system 106A and bus duct 120B can carry power received from secondary power system 106B. Each bus duct 120 includes an assembly of bus duct segments 121 which are connected in series at respective interfaces 122 at one or more ends of the respective segments 121. In the illustrated embodiment, each of the bus ducts 120A-B includes an assembly of three segments 121 connected in series, via interfaces 122, and terminating at respective end points 126A-B distal from the respective coupled secondary power system 106A-B.

Each secondary power busway 114C includes two separate feed boxes 115C-D which are each located at opposite ends of the busway 114C. Each one of the feed boxes 115C-D is coupled to a separate one of the bus ducts 120A-B via respective connection 123A-B and power cable 124. Each connection 123 is coupled to a particular bus duct 120 and can include one or more tap boxes, switching devices, including one or more circuit breakers, etc. A switching device in a connection 123 can provide switch support to a connection between the respective bus duct 120 and a coupled feed box 115C-D of secondary power busway 114B.

In some embodiments, the separate bus ducts 120A-B provide redundant secondary power support to rack computer systems 113 in an aisle space 110, via a secondary power busway 114C extending through the aisle space 110, by selectively distributing secondary power from one of the separate bus ducts 120A-B to the secondary power busway 114C, via a separate one of the connections 123A-B with a separate one of the feed boxes 115C-D of the busway 114C, at a given time. The busway 114C can be switched between receiving power from a separate one of the bus ducts 120A-B based at least in part upon switching the separate switching device in the separate connections 123A-B to electrically decouple the busway 114C from one bus duct and electrically couple the busway 114C with the other bus duct. The switching can be an open-transition switching operation, where busway 114C is electrically decoupled from a bus duct prior to electrically coupling to another bus duct.

In some embodiments, the bus ducts 120A-B are configured to electrically couple to separate ones of the aisle spaces 110 at a given time, so that each separate secondary power system 106 provides secondary power support to separate ones of the aisle spaces 110. The bus duct 120A-B electrically coupled to a secondary power busway in an aisle space 110 may alternate between adjacent aisle spaces 110 in data center. For example, the busway 114C in aisle space 110 proximate to the secondary power systems 106 may be electrically coupled to bus duct 120A, while the adjacent aisle space 110 includes a busway 114C electrically coupled to bus duct 120B, and the aisle space 110 distal from secondary power systems 106 includes a secondary power busway 114C electrically coupled to busway 120A.

Electrically coupling a busway with a bus duct includes coupling the busway via a connection that enables power distribution across the connection. For example, a feed box 115C coupled to bus duct 120A via connection 123A, where connection 123A includes a switching device, is electrically coupled to the bus ducts 120A when the switching device is in a closed position to enable electrical power carried by bus duct 120A to flow from bus duct 120A to busway 114C via connection 123A and feed box 115C. The feed box 115C is not electrically coupled to the busway 114C, although feedbox 115C is physically coupled to bus duct 120A via connection 123A, where the switching device in connection 123A is in an open position to preclude electrical power from flowing from bus duct 120A to busway 114C via feedbox 115C. In some embodiments, the switching device can be included in one or more of the feed boxes 115, in addition or in alternative to being located in one or more connections 123.

As used herein, redundant secondary power support refers to providing secondary power support via separate power feeds to the busway which can provide secondary power to rack computer systems, electrical loads, etc. The separate power feeds can provide power from separate power systems. As a result, secondary power support can be maintained upon the loss of at least one of the secondary power systems, power feeds from the power system to the busway, etc. For example, redundant secondary power support can include coupling the secondary power busway to separate bus ducts, which each carry power from separate secondary power systems, such that secondary power support via the busway can be maintained upon the loss of one of the bus ducts, secondary power systems, etc.

In some embodiments, a busway 114 is switched from receiving power from one bus duct 120 to receiving power from a separate bus duct 120, based at least in part upon a determination that at least a portion of the power distribution system 190 providing power to the busway 114 via the one bus duct 120, is to be de-energized. Such de-energization can include de-energizing the bus duct 120 feeding power to the busway 114 as part of extending the bus duct 120. For example, data center 100 may be expanded to include an additional aisle space 110 distal from secondary power systems 106. As a result, one or more of bus ducts 120A-B may be required to be extended to extend along an end of the additional aisle space 110. Such extension can include coupling an additional segment 121 to the end 126 of the respective bus duct 120. Such extension, in some embodiments, requires de-energization of the bus duct 120 being extended. In one example, where an aisle space 110 includes a busway 114C receiving power from bus duct 120A, and bus duct 120A is to be de-energized to be expanded via coupling of an additional segment 121 to end point 126A, busway 114C can be switched from bus duct 120A to bus duct 120B, so that busway 114C continues to receive secondary power, and continues to provide secondary power support to rack computer systems 113 in the aisle space 110, via power received from bus duct 120B.

Secondary power systems 106A-B each receive utility power from separate power sources 105A-B, respectively. Each secondary power system 106A-B can distribute secondary power to one or more various bus ducts 120, and provide secondary power support to various rack computer systems 113 in the aisle spaces 110 via one or more of the bus ducts 120A-B and coupled busways 114C, respectively. Each secondary power system can include various separate sets of power distribution components, including a utility transformer, generator, UPS, power distribution unit (PDU), etc.

In some embodiments, separate secondary power systems are electrically coupled at one or more locations in the respective secondary power systems. As a result, power can be distributed from one secondary power system to another secondary power system at a location in the other secondary power system. In the illustrated embodiment, for example, data center 100 includes secondary power systems 106A-B which are electrically coupled at respective upstream locations via an upstream power connection 109A and at respective downstream locations via a downstream power connection 109B. An upstream location in a secondary power system can be a utility switchboard which is upstream of at least one UPS and downstream of at least one utility transformer in the secondary power system. A downstream location in a secondary power system can be a distribution switchboard which is downstream of at least one UPS in the secondary power system.

Figure 2:
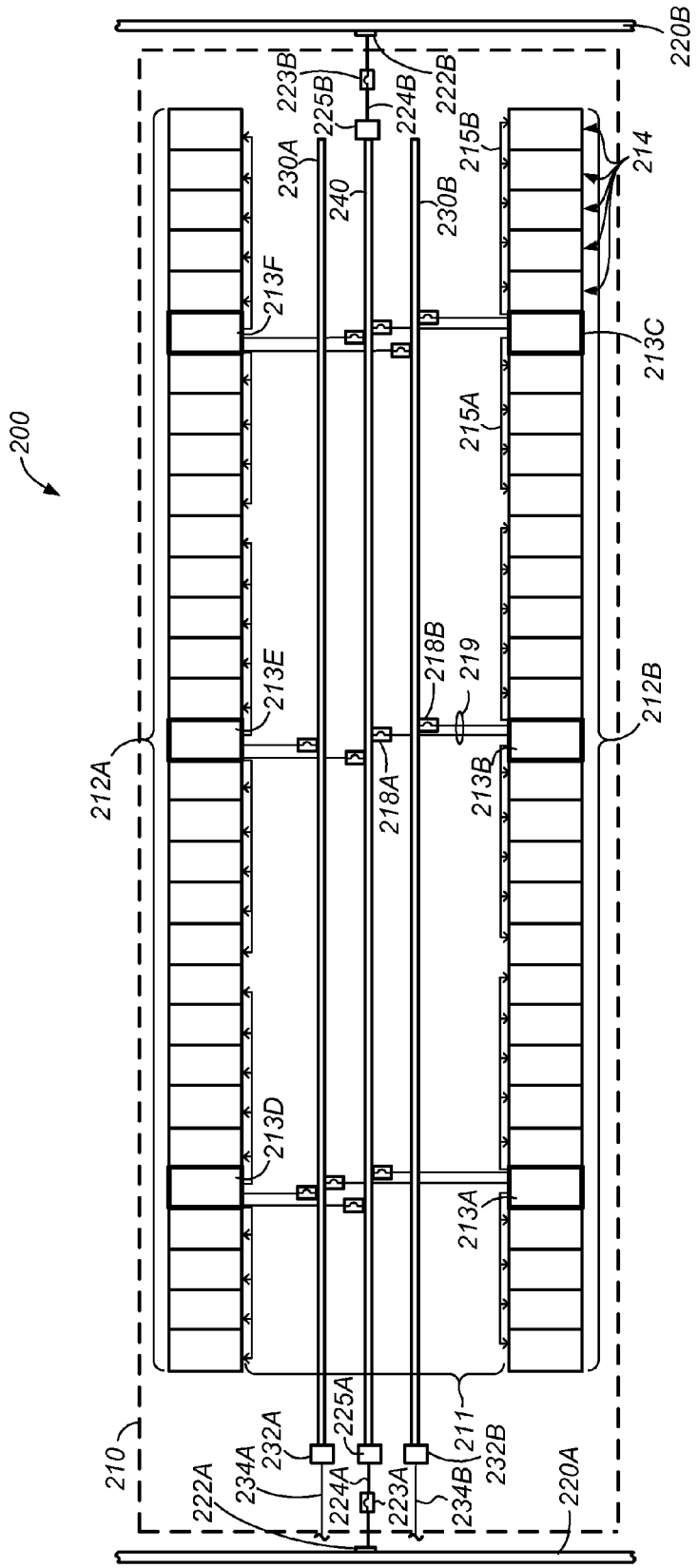
FIG. 2 is a schematic diagram illustrating a rack computer system aisle space, according to some embodiments.

FIG. 2 is a schematic diagram illustrating a rack computer system aisle space, according to some embodiments. In some embodiments, an aisle space is a computer room.

Data center 200 includes an aisle space 210 and separate bus ducts 220A-B which each extend along opposite ends of the aisle space 210 and are coupled to a power busway 240 in the aisle space to provide redundant secondary power support to rack computer systems 214 in the aisle space 210.

Aisle space 210 includes aisle 211, primary power busways 230A-B extending through a full length of the aisle 211, secondary power busway 240 extending through the full length of the aisle 211, and two rows 212A-B of electrical loads extending in parallel with the busways through the length of the aisle 211. Each primary power busway 230A-B receives power from a respective primary power source via respective power transmission lines 234A-B feeding into respective feed boxes 232A-B of the primary power busways 230A-B.

In some embodiments, an aisle space includes multiple busways that extend through a length of the aisle space, where an electrical load located in the aisle space electrically couples with one or more of the busways to receive one of multiple various power support redundancies. For example, in the illustrated embodiments, electrical loads 213A, 213D, 213E are electrically coupled, via respective sets of power cables 219 and tap boxes 218A-B, to busways 230A and 240 despite being located in various regions of the aisle space 210, and electrical loads 213B, 213C, and 213F are electrically coupled, via respective sets of power cables 219 and tap boxes 218A-B, to busways 220B and 220C despite being located in various regions of the aisle space 210. The electrical loads 212A-B can include rack computer systems 214 in which various computer systems are mounted in one or more racks, upstream components including ATS cabinets 213A-F which distribute power from one or more busways to various rack computer systems 214 via branch circuits 215A-B, etc.

The sets of power cables 219, tap boxes 218A-B, etc. can be coupled with one or more busways 230A-B, 240 via coupling the tap box 219 with the respective busway. Such tap boxes can include receptacle tap boxes, disconnect boxes, etc. In the illustrated embodiment, for example, load 213B can be a rack computer system coupled to busways 230B, 240 via separate power cables 219 and respective tap boxes 218B, 218A to receive N+1 power support redundancy from the coupled busways.

In some embodiments, secondary power busway 240 is coupled to each of the separate bus ducts 220A-B via separate connections with separate feed boxes 225A-B at opposite ends of the busway 240, where the busway 240 can electrically couple with a separate one of the coupled bus ducts 220A-B receive power from a selected one of the bus ducts. The busway 240 can switch between electrically coupling with one of the bus ducts 220A-B, where each of the bus ducts 220A-B can carry power from a separate secondary power systems. As a result, busway 240 can provide secondary power support to the loads 213, 214 in the aisle space 210 based at least in part upon power received from one of the bus ducts, where the secondary power support can be maintained upon the loss of power in the bus duct initially electrically coupled to the busway 240 by switching the busway 240 to electrically coupled with the other bus duct.

Each feed box 225A-B, located at a separate one of opposite ends of busway 240, is coupled to a respective connection 222A-B of a respective bus duct 220A-B which extends along the proximate end of the aisle space 210. Each connection 222A-B can include a tap box connected to the respective bus duct 220A-B.

In some embodiments, a connection between a feed box 225 and a bus duct 220 via a respective connection 222 includes a switching device 223 which can switch to electrically couple or decouple the feed box 225, and thus the busway 240, from the respective bus duct 220. In the illustrated embodiment, the switching devices 223A-B are physically separate from the feed boxes 225A-B and the bus duct connections 222A-B and are coupled to each via power transmission lines 224A-B. In some embodiments, the switching devices 223A-B are each located in a separate one or more of the feed boxes 225A-B, connections 222A-B, etc.

In some embodiments, one or more portions of data center 200 can be included in data center 100 illustrated above in FIG. 1. For example, aisle space 210 in FIG. 2 can be one or more of aisle spaces 110 in FIG. 1, bus ducts 220A-B in FIG. 2 can be one or more of bus ducts 120A-B in FIG. 1, etc.

Figure 3:
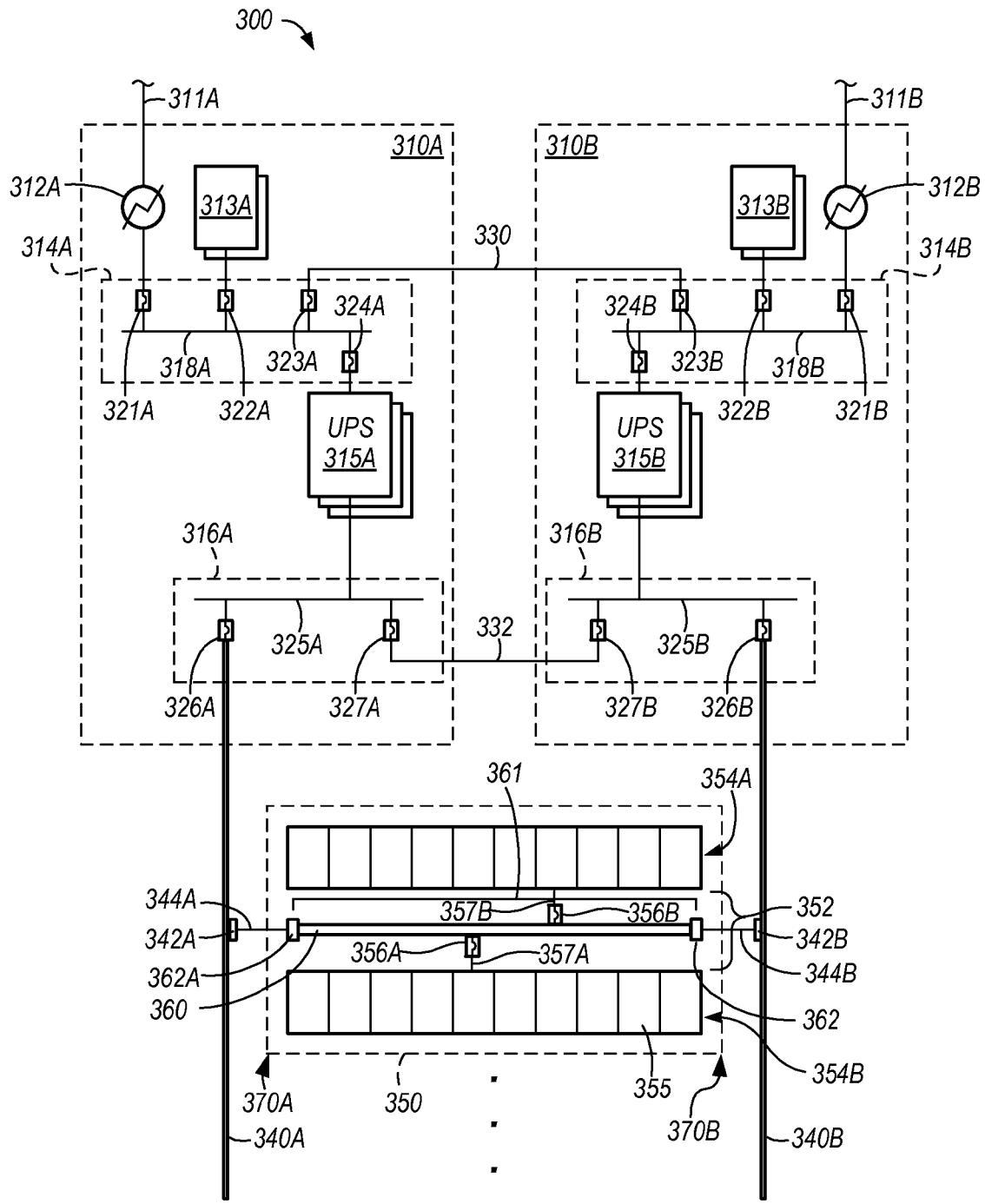
FIG. 3 is a schematic diagram illustrating a redundant secondary power support system including two separate secondary power systems electrically coupled on an upstream side and a downstream side, according to some embodiments.

FIG. 3 is a schematic diagram illustrating a redundant secondary power support system including two separate secondary power systems electrically coupled on an upstream side and a downstream side, according to some embodiments.

Data center 300 includes separate secondary power systems 310A, 310B, aisle spaces 350 extending through the data center 300, and bus ducts 340A-B extending from separate distribution switchboards 316A-B of separate secondary power systems 310A-B through the data center 300, so that each bus duct 340 extends along a separate opposite ends 370A-B of each of the aisle spaces 350 in the data center 300.

Each aisle space 350 in data center 300 includes an aisle 352 which at least partially spans a width of the aisle space 350 and a length 361 of the aisle space 350. At least two rows 354A-B of rack computer systems 355 extend through the length 361 of the aisle space 350 along opposite side ends of the aisle 352. Each of the rack computer systems 355 receives primary power support from one or more primary power systems. The rack computer systems 355 receive primary power support that is independent of the secondary power systems 310A-B, bus ducts 340A-B, etc.

Each aisle space 350 includes a secondary power busway 360 which provides secondary power support to the various rack computer systems 355 in the aisle space 350. Providing secondary power support includes providing a secondary power feed, received at the busway 360 from one of the bus ducts 340A-B, to be available to one or more downstream systems and components, including one or more of the rack computer systems 355. A provided power feed may be referred to herein as provided power; for example, a secondary power feed may be referred to as provided "secondary power", "secondary electrical power", etc. Provided power feeds may be precluded from being received by the rack computer systems but may be made available for receipt based at least in part upon a configuration, positioning, etc. of one or more components upstream of the systems and components. For example, a busway 360 may be electrically coupled, via one or more tap boxes 356 and power cables 357, with an automatic transfer switch which is electrically coupled to at least one of the rack computer systems via a branch circuit, where the automatic transfer switch selectively distributes power from either the primary power systems or the secondary power busway 360 to the rack computer systems 355. The busway 360 can be electrically coupled to an ATS, rack computer systems, etc. in separate rows 354A-B via respective tap boxes 356A-B coupled to the busway, and one or more power cables 357A-B connecting the respective tap box 356A-B with a power inlet of one or more of an ATS, rack computer system, etc. in the respective row 354A-B.

Each secondary power busway 360 is coupled to each of the bus ducts 340A-B via connection lines 344A-B which each couple a connection 342A-B, coupled to a separate one of the bus ducts 340A-B, to a feed box 362A-B which is at a separate one of opposite ends of busway 360. Connections 342A-B can include one or more tap boxes, which can include one or more switching devices, including circuit breakers, which can open or close to electrically decouple or couple a respective coupled bus duct with the secondary power busway 360. As a result, while busway 360 is physically coupled to each of the bus ducts 340A-B, busway 360 can be electrically coupled to a separate one of the two bus ducts 340A-B, so that the busway 360 receives power from a separate one of the bus ducts 340A-B at a given point in time. Switching devices included in the connections 342A-B can operate in counter-opposition, including opening one switch in one connection 342A concurrently with closing another switch in another connection 342B, to switch busway 360 from receiving secondary power from bus duct 340A to receiving power from bus duct 340B. Where switching devices are included in a connection, including one or more of connections 342A-B, the connection may be referred to as a switch-supported connection, switch-supported electrical connection, switch-supported tap box connection, etc.

Each secondary power system 310A, 310B includes a separate utility power feed 311A, 311B which receives power from a separate utility power source, and a utility transformer 312A, 312B which transforms the respective received utility power feed. Each secondary power system 310A, 310B includes one or more power generators 313A, 313B which can include one or more diesel generators, gas generators, etc.

As shown, each secondary power system 310A, 310B includes a respective utility switchboard 314A, 314B. Each utility switchboard 314 includes a power bus 318 and switching devices 321-324 which operate to distribute or obstruct power flow to or from the power bus 318. Switching devices 321-324 can include one or more circuit breakers. Switching devices 321A-B are operable to provide breaker support of utility power from the respective transformer 312A-B of the secondary power system 310A-B. Switching devices 322A-B are operable to provide breaker support of generator power from one or more generators 313A-B of the respective secondary power system 310A-B.

Switching devices 321, 322 in each secondary power system 310 can operate in an open-transition switching process to switch the bus 318 of the respective secondary power system 310 between receiving power from one of transformer 312 and generator 313 of the respective secondary power system 310.

Each secondary power system 310A, 310B includes one or more sets of UPS devices 315A, 315B. Power can be distributed from a utility switchboard 314 of a secondary power system 310 to a UPS 315 of that secondary power system. Such distributed power can, in some embodiments, bypass the UPS 315. A switching device 324 in each secondary power system 310 can provide breaker support of power distribution from the utility switchboard to the respective UPS 315 of the respective secondary power system 310.

Each secondary power system 310A, 310B includes a separate distribution switchboard 316A, 316B. Each distribution switchboard 316 of a secondary power system 310 can receive power from the respective UPS 315 of the secondary power system, including a bypass of the UPS 315. As shown, each distribution switchboard 316A, 316B includes a power bus 325A, 325B which is coupled, via a switching device 326A, 326B, to a separate bus duct 340A, 340B at a power inlet interface of the respective separate bus duct. As a result, power received at the distribution switchboard 316A, B of a given secondary power system 310A, B can distribute power, as secondary power, to a particular one of the bus ducts 340A, B which is coupled to the distribution switchboard 316A, 316B.

Data center 300 includes an upstream power connection 330 which can electrically couple the separate secondary power systems 310A-B at the respective utility switchboards 314A, 314B of the separate systems 310A-B. Switching devices 323A-B at each respective switchboard 314 can close or open to establish or terminate the electrical connection between the separate switchboards 314A-B. The upstream power connection 330 can enable a switchboard 314 of a particular secondary power system 310 to receive power from a switchboard 314 of another separate secondary power system 310. As a result, rack computer systems 355 in data center 300 can continue to receive secondary power support, even in the event of a loss of utility power, generator power, etc. at one of the secondary power systems 310.

Such a loss of utility power may be pre-planned, so that a secondary power system 310 is switched to receive power from the other secondary power system 310 prior to a loss of utility power. For example, utility transformer 312A may need to be de-energized for maintenance, inspection, etc. Such a time period in which the transformer 312A is anticipated to be de-energized may exceed the capability of the generators 313A to supply power. For example, the time period may exceed the fuel capacity of the generators 313A. As a result, switching devices 321A, 323A can switch, in an open-transition switching process, to distribute power from the utility transformer 312B of the other secondary power system 310B to the switchboard 314B, so that power from the utility transformer 312B is distributed to UPS 315A, and thus to various busways 360 electrically coupled to bus duct 340A. Transformer 312B may continue to distribute power to UPSs 315B, and thus bus duct 340B, while also distributing power to switchboard 314A. As a result, each bust duct 340A-B may carry power from a common utility feed 311B. Where a fault is determined to be occurring with regard to transformer 312B while power is being distributed from transformer 312B to both switchboards 314A-B, the connection 330 may be decoupled via one or more of switches 323A-B, and at least secondary power system 310A may switch to receiving power from generators 313A.

Data center 300 includes a downstream power connection 332 which can electrically couple the separate secondary power systems 310A-B at the respective distribution switchboards 316A, 316B of the separate systems 310A-B. In some embodiments, power connection 332 comprises one or more bus ducts. Switching devices 327A-B at each respective switchboard 316 can close or open to establish or terminate the electrical connection. The downstream power connection 332 can enable a switchboard 316 of a particular secondary power system 310 to receive power from a switchboard 316 of another separate secondary power system 310. As a switchboard 316 can receive power from a UPS 315 of the secondary power system, the downstream power connection 332 can enable a switchboard 316 of a particular secondary power system 310 to receive power from a UPS 315 of another separate secondary power system 310. As a result, rack computer systems 355 in data center 300 can continue to receive secondary power support, even in the event of a loss of power in one of the secondary power systems, a failure of a component in a secondary power system, etc., as power can be distributed from a distribution switchboard 316 of one secondary power system 310 to the distribution switchboard 316 of another secondary power system 310 to provide power to the coupled bus duct 340. Such a component failure can include a failure of power output from a UPS 315 in a secondary power system. As a result, a power output from a UPS 315 in another separate secondary power system can be provided, via connection 332, so compensate for the local loss of UPS 315 power output.

In some embodiments, a data center 300 includes a distribution switchboard which exists independently of a secondary power system. For example, secondary power system 310B may be absent from data center 300, yet distribution switchboard 316B may be present in data center 300 and may be coupled to bus duct 340B. Secondary power system 310A can provide power to bus duct 340B, via connection 332 and distribution switchboard 316B, in the absence of secondary power system 310B. Such an absence may be due in part to design. For example, data center 300 may be initially constructed with a single secondary power system 310A and both bus ducts 340A-B. While secondary power system 310B may be subsequently installed in data center 300, secondary power system 310A can supply power to both bus ducts 340A-B in the interim, such that the busways 360 in the aisle spaces 350 can receive secondary power support from either bus ducts 340A-B, even though only a single secondary power system 310A provides power to the bus ducts 340A-B. When secondary power system 310B is subsequently installed, switchboard 316B is incorporated into the power system 310B and the separate power systems 310A-B can each distribute power to separate bus ducts 340A, 340B which are coupled to respective distribution switchboards 316 of the separate power systems 310A, 310B.

In some embodiments, one or more portions of data center 300 can be included in data center 100 illustrated above in FIG. 1. For example, aisle space 350 in FIG. 3 can be one or more of aisle spaces 110 in FIG. 1, bus ducts 340A-B in FIG. 3 can be one or more of bus ducts 120A-B in FIG. 1, one or more of secondary power systems 310A-B can be one or more of secondary power systems 106A-B, etc.

Figure 4A:
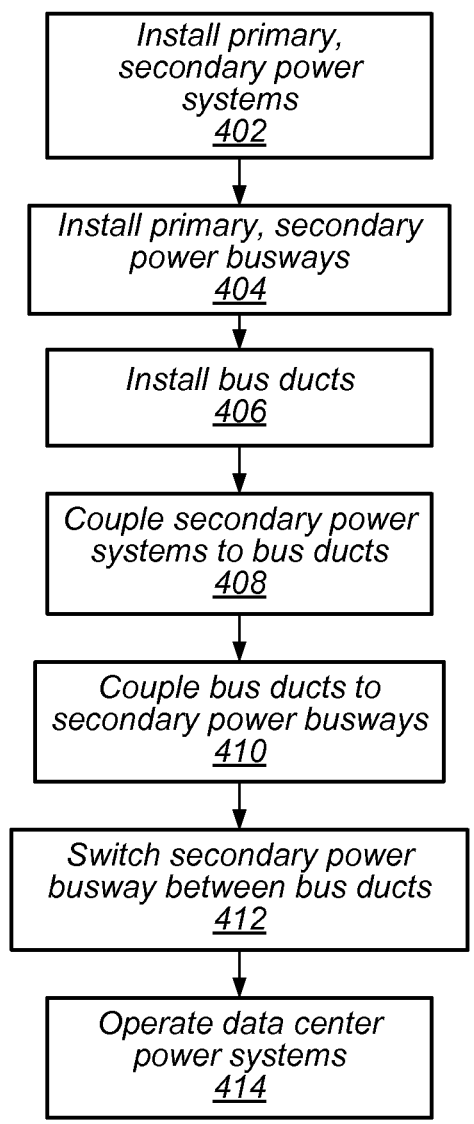
FIG. 4A illustrates configuring power distribution systems to provide primary power support and redundant secondary power support to electrical loads in an aisle space, according to some embodiments.

FIG. 4A illustrates configuring power distribution systems to provide primary power support and redundant secondary power support to electrical loads in an aisle space, according to some embodiments. Such configuring can be implemented with respect to some or all of the various portions of the data centers illustrated in FIG. 1-3, etc.

At 402, one or more primary power systems and secondary power systems are installed in a data center. As shown with regard to FIG. 3, a given power system can include one or more of a utility power feed, UPS, utility switchboard, distribution switchboard, etc. Installation of a primary power system can include electrically coupling an output of the primary power system, including a distribution switchboard, to one or more electrical loads in the data center, including one or more rack computer systems. Electrically coupling a power system with an electrical load can include electrically coupling an output of the power system with a busway which is coupled with a power inlet of the electrical load, a component which is configured to distribute power to the load, etc. For example, a power output of a primary power system can be electrically coupled, via one or more power transmission lines, busways, bus ducts, etc., with a primary power busway which extends through an aisle space, as shown in FIG. 1-3, where the busway is electrically coupled, via a tap box coupled to the busway and a power cable extending from the tap box, to a power inlet of a component in the aisle space, which can include a power inlet of a rack computer system, a power inlet of an ATS configured to selectively route power from various inlets to a downstream rack computer system, etc.

At 404, one or more power busways are installed in an aisle space of the data center. The busways can extend through part or all of the length of the aisle space and can be electrically coupled, via one or more tap boxes, power cables, etc., to one or more components in the aisle space, including electrical loads. The busways can include a set of busways which can include one or more primary power busways, one or more secondary power busways, etc. A primary power busway is a busway which is configured to receive power from a primary power system and provide the power ("primary power") to one or more loads. A secondary power busway is a busway which is configured to receive power from one or more secondary power systems and provide the power ("secondary power") to one or more loads.

At 406, two or more bus ducts are installed in the data center. The bus ducts can be installed to extend through various portions of a data center, so that the separate bus ducts each extend proximate to separate and opposite ends of one or more aisle spaces in the data center. At 408, the installed bus ducts are electrically coupled to an output of one or more secondary power systems, which can include outputs of a common secondary power system, separate outputs of separate secondary power systems, etc. In some embodiments, including the embodiment shown in FIG. 3, each bus duct is coupled to a separate distribution switchboard of a separate secondary power system, so that each bus duct is configured to receive power from a separate distribution switchboard of a separate secondary power system. In some embodiments, the bus ducts can receive power from a common power source via the separate distribution switchboards.

At 410, each of the bus ducts is coupled to a secondary power busway in an aisle space at separate and opposite ends of the busway. The busway can include separate feed boxes at the opposite ends, and each of the bus ducts may be coupled to a separate feed box. The bus ducts can be coupled to the separate ends of the busway via separate connections, connection lines, etc. A connection can include a tap box which couples with a respective bus duct and couples the bus duct with a feed box of the busway. A connection can include one or more switching devices, which can include one or more circuit breakers. Coupling a bus duct with a busway may be separate from electrically coupling the bus duct with the busway. For example, where a connection includes a switching device in an open position, the bus duct may be connected with a feed box of a busway, yet power is precluded from flowing from the bus duct to the busway. Where the switching device is in a closed position, bus duct can be electrically coupled with the busway, as power flow from the bus duct to the busway is enabled.

In some embodiments, one bus duct is coupled with one end of the busway and another bus duct is both coupled with the other end of the busway and is electrically coupled with the busway, so that power is received at the busway from one bus duct and not another bus duct. The bus duct that is electrically coupled to the busway may be selected. As a result, where a data center includes multiple aisle spaces, one bus duct may be electrically coupled to one portion of the secondary power busways in the aisle spaces, and another bus duct may be electrically coupled to another separate portion of secondary power busways in the aisle spaces, so that secondary power support for the various loads in the multiple aisle spaces is divided between the two bus ducts, and the secondary power systems supplying the respective bus ducts. In some embodiments, the bus ducts are electrically coupled to an approximately equal quantity of busways at a given time, so that secondary power support is divided approximately evenly between the two bus ducts.

At 412, a secondary power busway in the data center is reversibly switched between receiving power from one of the two or more bus ducts, so that one of the bus ducts provides secondary power to the busway to provide secondary power support to the loads electrically coupled to the busway. Where a busway is coupled, at opposite ends, with separate bus ducts via one or more respective connections, the busway can be switched between the bus ducts based at least in part upon operation of switching devices in the connections. For example, a switching device in a connection between one end of the busway and one of the bus ducts may switch to an open position, terminating a flow of power between that bus duct and the busway, and another switching device in another connection between an opposite end of the busway and another bus duct may switch to a closed position, establishing a flow of power between the other bus duct and the busway. The operation of the switches may be an open-transition switching operation, so that one switch opens before another switch closes and the switches in the separate connections are not closed at the same time. The switching devices, in some embodiments, are included in one or more of a feed box of the busway, a connection tap box coupled to a bus duct, a stand-alone device between the connection tap box and a feed box, etc.

At 414, The various power distribution systems in the data center, including one or more primary power systems, secondary power systems, etc. are operated to provide power to one or more electrical loads in the data center via the various busways installed in the aisle spaces, the various bus ducts, etc. Primary power may be provided, via a primary power busway in each aisle space, to an ATS device in the aisle space, and secondary power may be provided to the ATS device via a secondary power busway. The ATS device may selectively distribute one of primary power and secondary power to various rack computer systems downstream of the ATS device via one or more branch circuit connections.

Figure 4B:
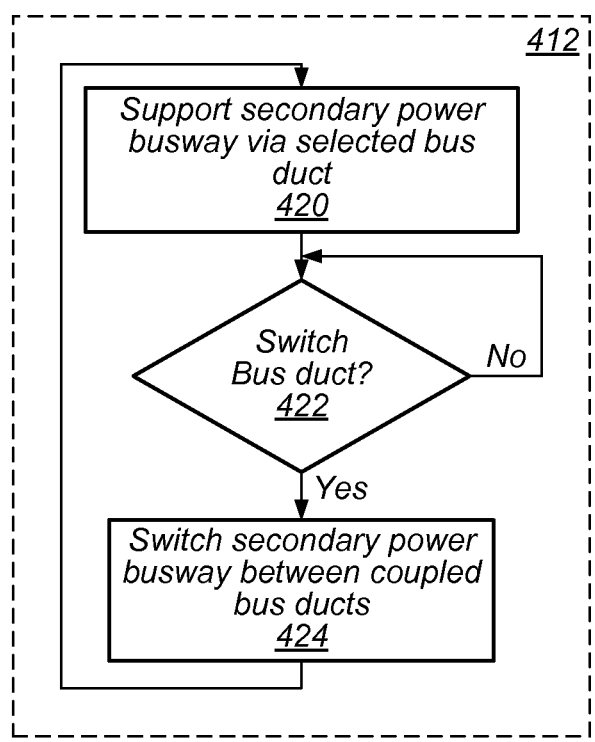
FIG. 4B illustrates maintaining secondary power support to electrical loads in an aisle space, according to some embodiments.

FIG. 4B illustrates maintaining secondary power support to electrical loads in an aisle space, according to some embodiments. Such maintaining can be implemented with respect to some or all of the various portions of the data centers illustrated in FIG. 1-3, etc. As shown, such maintaining may be implemented as part of switching one or more busways between various coupled bus ducts, as shown in 412 of FIG. 4A.

At 420, a secondary power busway provides secondary power support to various electrical loads in an aisle space based at least in part upon providing secondary power received from a selected one of the various bus ducts to which the busway is coupled. The various bus ducts can carry power from separate secondary power systems, and the busway may be switched to receive power from a particular one of the bus ducts. The busway may be switched to a particular one of the bus ducts as part of a power support distribution scheme, where each bus duct provides power to a separate portion of busways in various aisle spaces of a data center, so that secondary power support is distributed amongst the various bus ducts, secondary power systems supplying power to the various bus ducts, etc.

At 422, a determination is made regarding whether to switch the busway to receive power from another bus duct to which the busway is coupled. Such a determination may be based at least in part upon a determination that one of the bus ducts to which the busway is to be coupled is to be de-energized. A bus duct may be de-energized for various reasons, including maintenance, inspection, modification of the bus duct, etc. For example, where a bus duct is comprised of multiple bus duct segments coupled in series, an additional one or more segments may be coupled to an end of the bus duct to extend the bus duct through an additional portion of the data center. Such expansion may be implemented to enable the bus duct to extend along an end of a newly installed aisle space in the data center. Coupling one or more additional bus duct segments to a bus duct may involve de-energizing the bus duct. Where the bus duct to be de-energized is the bus duct to which a busway is presently electrically coupled and receiving secondary power therefrom, de-energization of the bus duct can lead to loss of secondary power support via that bus duct.

At 424, the busway is switched from one coupled bus duct to another coupled bus duct, so that the busway ceases to receive power from the one coupled bus duct and begins to receive power from the other coupled bus duct. Switching between bus ducts can include electrically decoupling from one bus duct and electrically coupling with another separate bus duct. Electrically coupling with a bus duct can include closing an electrical connection with a physically-coupled bus duct. Switching a busway from one bus duct to another can include operating two or more switching devices, each of which is included in a connection between one end of the busway and a bus duct proximate to that end, to open an electrical connection between one end of the busway and one bus duct and to close an electrical connection between another end of the busway and another bus duct. The operation of the switching devices can be an open-transition switching process. In some embodiments, the switching devices included in connections on opposite ends of a busway are coupled to an interlock system which precludes the two switching devices from being concurrently in a closed position. For example, an interlock may be configured to preclude one switching device, included in a connection between one end of a busway and a particular bus duct, from being moved to a closed position while another switching device, included in a connection between the opposite end of the busway and a separate bus duct, is also in a closed position.

Figure 5A:
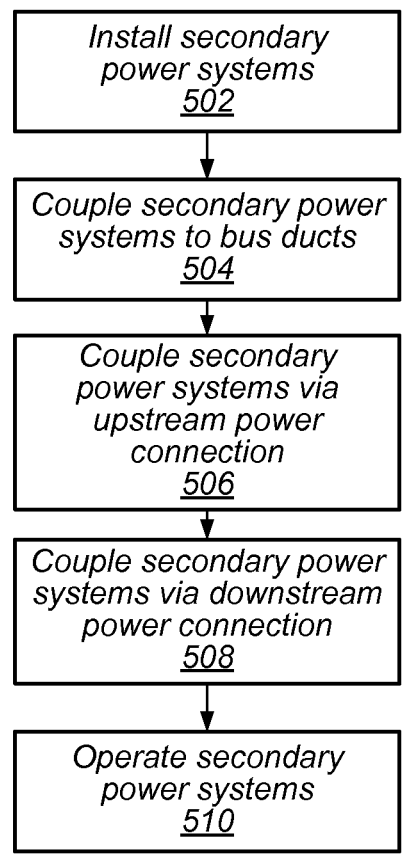
FIG. 5A illustrates configuring separate secondary power systems to provide redundant secondary power support to electrical loads, according to some embodiments.

FIG. 5A illustrates configuring separate secondary power systems to provide redundant secondary power support to electrical loads, according to some embodiments. Such configuring can be implemented with respect to some or all of the various portions of the data centers illustrated in FIG. 1-3, etc.

At 502, one or more secondary power systems are installed in a data center. As shown with regard to FIG. 3, a given secondary power system can include one or more of a utility power feed, UPS, utility switchboard, distribution switchboard, etc. Installation of a secondary power system can include coupling the various components with at least a utility power feed.

At 504, each of the secondary power systems is coupled to at least one bus duct extending through the data center. Each bus duct can be coupled to multiple busways which each extend through various separate aisle spaces in the data center and each can provide secondary power support to the electrical loads in the separate aisle spaces through which they extend. Each bus duct may, at a given time, be electrically coupled to a limited portion of the busways to which the bus duct is coupled, so that the bus duct provides power to the limited portion of the busways and not a remainder portion of the busways to which the bus duct is coupled.

In some embodiments, each secondary power system is coupled to a bus duct via coupling a power feed interface of the bus duct to a distribution switchboard of the secondary power system, such as is illustrated above in FIG. 3. Such coupling can configure a secondary power system to distribute power to the coupled bus duct via the switchboard and can configure the bus duct to receive power from at least the secondary power system via the switchboard.

At 506, the separate secondary power systems are coupled, at respective locations in the separate systems which are downstream of respective utility transformers and upstream of respective UPSs, via an upstream power connection. The upstream power connection may be coupled, at opposite ends, to respective utility switchboards of the two separate secondary power systems, so that the separate power systems are coupled at the respective utility switchboards of the systems. The connection can include switching devices, circuit breakers, etc. at each switchboard, so that the separate power systems can be selectively electrically coupled and decoupled based at least in part upon operation of the switching devices to close the circuit connection between the switchboards. The connection can enable power to be distributed from a utility switchboard of one secondary power system to a utility switchboard of another secondary power system and further distributed to various downstream components of the other secondary power system, including UPSs, distribution switchboards, transformers, PDUs, bus ducts, etc.

A secondary power system distributing power to another secondary power system via the upstream power connection can continue to distribute power from the local secondary power system's utility switchboard to various downstream components, including UPSs, distribution switchboards, transformers, PDUs, bus ducts, etc., so that power is distributed from the local secondary power system's utility switchboard to downstream components of each of the electrically coupled secondary power systems via one or more upstream power connections. In some embodiments, a switching device can be operated to isolate a secondary power system's downstream components from the utility switchboard which is distributing power to another secondary power system's utility switchboard via an upstream power connection.

At 508, the separate secondary power systems are coupled, at respective locations in the separate systems which are downstream of respective UPSs, via a downstream power connection. The downstream power connection may be coupled, at opposite ends, to respective distribution switchboards of the two separate secondary power systems, so that the separate power systems are coupled at the respective distribution switchboards of the systems. The connection can include switching devices, circuit breakers, etc. at each switchboard, so that the separate power systems can be selectively electrically coupled and decoupled based at least in part upon operation of the switching devices to close the circuit connection between the switchboards. The connection can enable power to be distributed from a distribution switchboard of one secondary power system to a distribution switchboard of another secondary system and further distributed to various components coupled to the distribution switchboard of the other secondary power system, including one or more bus ducts.

A secondary power system distributing power to another secondary power system via the downstream power connection can continue to distribute power from the local secondary power system's distribution switchboard to various downstream components, including bus ducts, so that power is distributed from the local secondary power system's distribution switchboard to bus ducts coupled to each of the electrically coupled secondary power systems via one or more downstream power connections. In some embodiments, a switching device can be operated to isolate a bus duct from the secondary power system's distribution switchboard which is distributing power to another secondary power system's distribution switchboard via a downstream power connection.

At 510, one or more of the secondary power systems are operated to provide secondary power support to electrical loads in the data center. A secondary power system may transform, via a local utility transformer, a utility power feed and distribute such power to various bus ducts in the data center. The bus ducts may provide such power to one or more busways in the data center which are electrically coupled to various components, including rack computer systems, ATSs, etc.

Figure 5B:
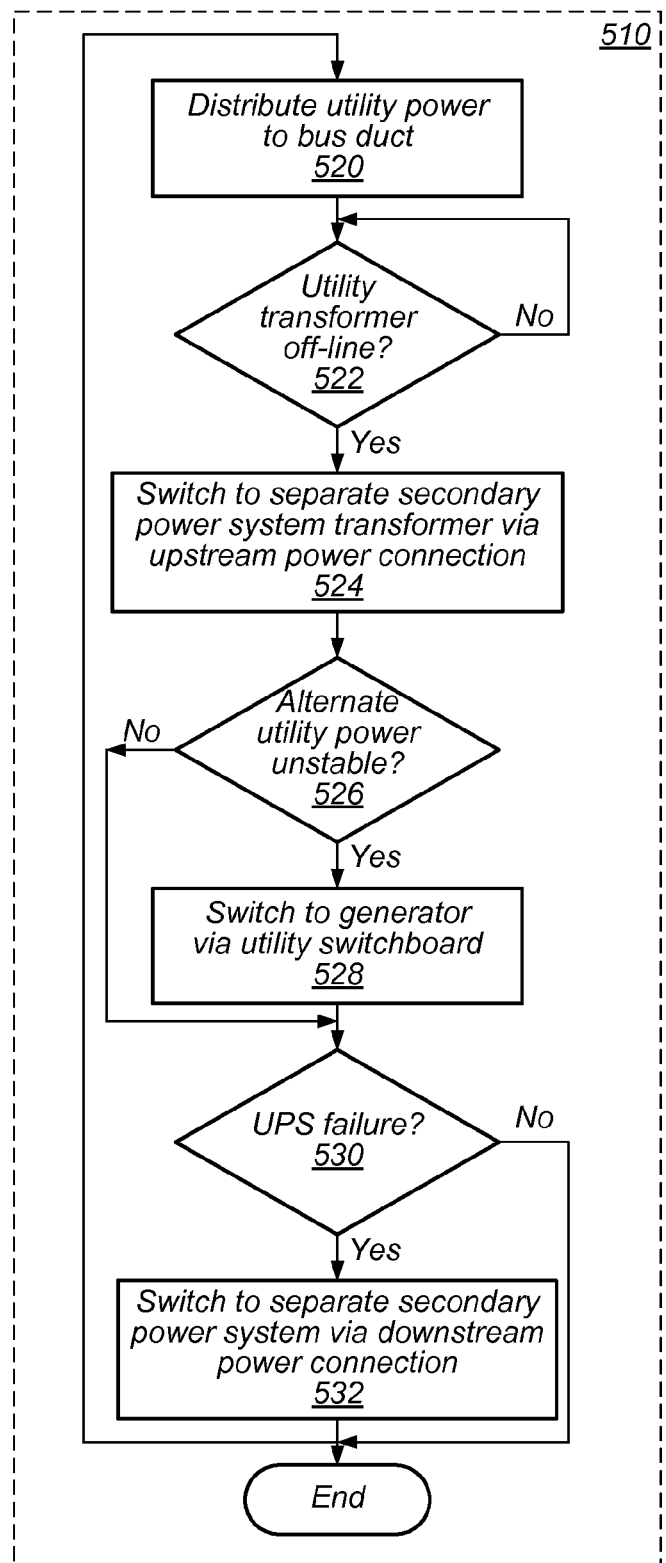
FIG. 5B illustrates maintaining secondary power support to electrical loads in an aisle space, according to some embodiments.

FIG. 5B illustrates maintaining secondary power support to electrical loads in an aisle space, according to some embodiments. Such maintaining can be implemented with respect to some or all of the various portions of the data centers illustrated in FIG. 1-3, etc. As shown, such maintaining may be implemented as part of operating one or more secondary power systems, as shown in 510 of FIG. 5A.

At 520, a secondary power system distributes power received from one or more utility power feeds to one or more bus ducts. The secondary power system can include a utility transformer which steps down a received utility power feed and distributes the stepped-down power feed to various components which are downstream of the transformer in the secondary power system. The bus ducts can be coupled to a component of the secondary power system, including a distribution switchboard, which is downstream of other components in the secondary power system, including a utility transformer, utility switchboard, UPS, etc., so that the bus ducts receive a power feed which originates at least at the utility transformer of the secondary power system. At 522, a determination is made regarding whether a utility transformer in the secondary power system, which is presently distributing stepped-down power to downstream components, is to be de-energized. Such de-energization may be implemented for various reasons, including maintenance, inspection, overhaul, replacement, etc.

At 524, if a utility transformer of the secondary power system is to be de-energized, such that the stepped-down power feed will be unavailable to the various downstream components upon such de-energization, the secondary power system is switched to receive a power feed from a separate secondary power system via an upstream power connection, so that various downstream components in the secondary power system, including a utility switchboard, various UPSs, distribution switchboards, downstream transformers, PDUs, bus ducts, etc., receive power from the other secondary power system via the upstream power connection. The upstream power connection may be coupled to the utility switchboard of the secondary power system, and switching to power from the other secondary power system can include opening a switching device which couples the utility transformer to the switchboard and closing a switching device which couples the upstream power connection to the switchboard. The operating of the switching devices may be an open-transition switching process.

Upon switching the secondary power system to the separate secondary power system via the upstream power connection, power may be received at the local utility switchboard from a utility switchboard of the other secondary power system, the other utility switchboard receives power from a utility transformer of the separate secondary power system. The other utility transformer may step-down a utility power feed which is separate from the utility power feed received at the local utility transformer which is to be de-energized, including a utility power feed received from a separate utility power source. In addition, upon switching the secondary power system, the utility transformer may be electrically isolated from downstream components in the secondary power system, including the utility switchboard. Upon being isolated, the utility transformer can be de-energized without affecting the distribution of power to various downstream components in the secondary power system.

In some embodiments, the secondary power system includes one or more local power generators, which can include diesel-powered generators. Despite including such generators, a secondary power system may be switched to receive power from a separate secondary power system, via one or more power connections. For example, an anticipated time duration during which the local utility generator is to be de-energized may exceed the time duration during which the local generator can supply power in place of the utility power feed. In addition, as fuel required to operate a generator may be costly, switching to the separate secondary power system may be less expensive than using the local generator, although both secondary power systems may, as a result of the switching, rely on a common set of components for power distribution, including various components in the other secondary power system that are upstream of the upstream power connection, including the utility transformer of the other secondary power system.

At 526 and 528, where power received from the other secondary power system, via the upstream power connection, is unstable, unavailable, failed, etc., such that the other secondary power system is unable to provide power to supplant the de-energized local utility transformer, the local secondary power system is switched from the upstream power connection to one or more local generators. In addition, the other secondary power system may be switched to its own local generators. As a result, the separate secondary power systems provide redundant secondary power support via power from separate sets of generators.

At 530 and 532, if a fault is determined with respect to one or more various downstream components in a secondary power system, such power distribution from the one or more various downstream components is interrupted, failed, unstable, etc., the secondary power system is switched to receive a power feed from a separate secondary power system via a downstream power connection, so that various bus ducts coupled to the secondary power system receive power from the other secondary power system via the downstream power connection. The downstream components for which a fault may be determined can include one or more UPSs in the secondary power system which distribute power to a distribution switchboard of the secondary power system. The downstream power connection may be coupled to the distribution switchboard of the secondary power system, and switching to power from the other secondary power system can include opening a switching device which couples the local UPS to the switchboard and closing a switching device which couples the downstream power connection to the switchboard. The operating of the switching devices can be one or more of an open-transition switching process, closed-transition switching process, etc. Upon switching the secondary power system to the separate secondary power system via the downstream power connection, power may be received at the local distribution switchboard from a distribution switchboard of the other secondary power system, where the other distribution switchboard receives power from a downstream component which is equivalent to the local downstream component for which a fault is determined, including a UPS. For example, a UPS in a separate secondary power system may provide UPS support to a bus duct coupled to a local distribution switchboard of a secondary power system, via the downstream power connection, where a fault is determined with regard to a local UPS.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
an aisle space configured to provide computing capacity, wherein the aisle space comprises:
at least one row of rack computer systems extending along a length of the aisle space;
at least two primary power busways extending through the aisle space in parallel with the at least one row of rack computer systems and configured to distribute primary power, received at each primary power busway of the at least two primary power busways from separate primary power systems, to the at least one row of rack computer systems to provide primary power support to the at least one row of rack computer systems; and
at least one secondary power busway extending through the aisle space in parallel with the at least one row of rack computer systems, wherein the at least one secondary power busway comprises separate feed boxes at opposite ends and is configured to distribute secondary power, received in at least one of the separate feed boxes, to the at least one row of rack computer systems; and
at least two bus ducts, wherein each bus duct extends along opposite ends of the length of the aisle space and is configured to distribute secondary power from at least one secondary power system to a separate one of the separate feed boxes of the at least one secondary power busway to provide redundant secondary power support to the at least one row of rack computer systems via the at least one secondary power busway.

2. The data center of claim 1, wherein:
the at least two bus ducts are each configured to distribute secondary power from a separate one of at least two secondary power systems to a separate one of the separate feed boxes via a separate one of at least two switching devices; and
the at least two switching devices are collectively configured to switch between electrically coupling a selected one of the at least two bus ducts to a separate one of the feed boxes of the secondary power busway.

3. The data center of claim 2, wherein:
each secondary power system of the at least two secondary power systems comprises:
a utility power transformer configured to transform and distribute utility power, an uninterruptible power supply (UPS) configured to distribute power received from the utility power transformer to at least one of the at least two bus ducts, and a utility switchboard configured to distribute power to the UPS; and each of the utility switchboards of the at least two secondary power systems are configured to electrically couple to each other, via an upstream power connection between the respective utility switchboards, to enable distribution of utility power from a utility power transformer of one of the at least two secondary power systems to a UPS of another one of the at least two secondary power systems.

4. The data center of claim 2, wherein:

the aisle space comprises a plurality of parallel aisle spaces which extend in parallel along separate lengths;

the at least one secondary power busway comprises a plurality of secondary power busways which extend in parallel through separate aisle spaces of the plurality of parallel aisle spaces;

the at least two bus ducts are each configured to extend along opposite ends of each of the plurality of parallel aisle spaces and couple with opposite ends of each of the plurality of secondary power busways; and each bus duct of the at least two bus ducts is configured to distribute secondary power from at least one secondary power system to at least a separate portion of the plurality of secondary power busways.

5. A system, comprising:

at least two bus ducts which are each configured to provide redundant secondary power support from at least one secondary power system to one or more sets of electrical loads located in one or more aisle spaces, wherein each set of electrical loads, of the one or more sets of electrical loads, receives independent primary power support from at least one separate primary power system;

wherein, to provide redundant secondary power support to one or more sets of electrical loads located in the one or more aisle spaces, the at least two bus ducts are each configured to couple with a separate one of opposite ends of a secondary power busway which extends through the one or more aisle spaces and is configured to distribute electrical power to the one or more sets of electrical loads.

6. The system of claim 5, wherein:

to provide redundant secondary power support to the one or more sets of electrical loads located in the one or more aisle spaces, the at least two bus ducts are configured to selectively distribute electrical power, from a selected bus duct of the at least two bus ducts, to the secondary power busway, such that the secondary power busway receives electrical power from the selected bus duct of the at least two bus ducts.

7. The system of claim 6, wherein:

the at least two bus ducts are each configured to provide redundant secondary power support from a separate secondary power system of at least two secondary power systems.

8. The system of claim 7, wherein:

each secondary power system of the at least two secondary power systems comprises:

a utility power transformer configured to transform and distribute utility power, and an uninterruptible power supply (UPS) configured to distribute power received from the utility power transformer to at least one of the at least two bus ducts; and the at least two secondary power systems are configured to electrically couple together, at respective switchboards which are each configured to distribute utility power from a respective transformer to a respective UPS of the respective secondary power system, to enable a utility transformer of one secondary power system of the at least two secondary power systems to distribute utility power to at least one UPS of each secondary power system of the at least two secondary power systems.

9. The system of claim 8, wherein:

the at least two secondary power systems are configured to electrically couple together, at respective switchboards which are each downstream of the respective UPSs of the respective secondary power system, to enable a UPS of one secondary power system of the at least two secondary power systems to distribute secondary power to each bus duct of the at least two bus ducts.

10. The system of claim 6, wherein:

to couple with a separate one of opposite ends of a secondary power busway which extends through the one or more aisle spaces, the at least two bus ducts are each configured to electrically couple with a separate one of the opposite ends of the secondary power busway via a separate switching device of at least two switching devices; and the at least two switching devices are collectively configured to selectively distribute power from a selected bus duct of the at least two bus ducts to the secondary power busway at any given time.

11. The system of claim 10, wherein:

to selectively distribute power from a selected bus duct of the at least two bus ducts to the secondary power busway at any given time, the at least two switching devices are configured to execute an open-transition switching operation, such that:

one switching device of the at least two switching devices opens to electrically decouple a selected bus duct of the at least two bus ducts from the secondary power busway, and another switching device of the at least two switching devices closes to electrically couple another selected bus duct of the at least two bus ducts to the secondary power busway.

12. The system of claim 5, wherein:

the one or more sets of electrical loads located in one or more aisle spaces comprises a plurality of rows of rack computer systems that each extend along a separate one of a plurality of parallel aisle spaces;

each of the plurality of aisle spaces extend in parallel from a particular aisle end that is proximate to a particular side of an enclosure to an opposite aisle end that is proximate to an opposite side of the enclosure;

the secondary power busway comprises a plurality of secondary power busways that each extend between the particular aisle end and the opposite aisle end of a separate aisle space of the plurality of aisle spaces;

the at least two bus ducts comprise two bus ducts that each extend along a separate one of the particular aisle ends of each of the plurality of aisle spaces or the opposite aisle ends of each of the plurality of aisle spaces; and each bus duct of the two bus ducts is configured to couple to each of the plurality of secondary power busways via the respective one of the particular aisle ends or the opposite aisle ends along which the respective bus duct extends.

13. The system of claim 12, wherein:
total power requirements of the one or more sets of electrical loads exceed a capacity of the at least one secondary power system to supply electrical power via the at least two bus ducts; and
the at least two bus ducts are each configured to distribute electrical power to a separate portion of the plurality of rows of rack computer systems.

14. A method, comprising:
configuring a power distribution system to provide redundant secondary power support to electrical loads, wherein the configuring comprises:
configuring a secondary power busway to extend along a length of an aisle space that includes a row of electrical loads which are configured to receive primary power support, from at least one primary power system, independently of the secondary power busway; and
configuring at least two bus ducts to each couple to separate opposite ends of the secondary power busway and to each carry electrical power received from at least one secondary power system to configure the secondary power busway to provide electrical power from a selected bus duct, of the at least two bus ducts, to the electrical loads, independently of the at least one primary power system.

15. The method of claim 14, wherein:
the at least one secondary power system comprises at least two secondary power systems;
configuring at least two bus ducts to each carry electrical power received from at least one secondary power system comprises configuring each of the at least two bus ducts to carry electrical power received from a separate secondary power system of the at least two secondary power systems; and
configuring the secondary power busway to provide electrical power from a selected one of the at least two bus ducts to the electrical loads comprises configuring the secondary power busway to selectively receive electrical power from a selected bus duct of the at least two bus ducts which carries electrical power from a selected secondary power system of the at least two secondary power systems.

16. The method of claim 15, wherein:
configuring the secondary power busway to selectively receive electrical power from a selected bus duct of the at least two bus ducts which carries power from a selected secondary power system of the at least two secondary power systems comprises switching the secondary power busway from receiving power from one bus duct to receiving power from another bus duct, based at least in part upon a determination that the one bus duct is to be de-energized.

17. The method of claim 15, wherein:
each secondary power system of the at least two secondary power systems comprises:
a utility power transformer configured to transform and distribute utility power, and
an uninterruptible power supply (UPS) configured to distribute power received from the utility power transformer to at least one of the at least two bus ducts; and
the at least two secondary power systems are configured to electrically couple together, at respective switchboards which are each configured to distribute utility power from a respective transformer to a respective UPS of a respective secondary power system, to enable a utility transformer of one secondary power system of the at least two secondary power systems to distribute utility power to at least one UPS of each secondary power system of the at least two secondary power systems.

18. The method of claim 17, wherein
the at least two secondary power systems are configured to electrically couple together, at respective switchboards which are each downstream of the respective UPSs of the respective secondary power system, to enable a UPS of one of the at least two secondary power systems to distribute secondary power to each bus duct of the at least two bus ducts.

19. The method of claim 14, wherein:
configuring at least two bus ducts to each couple to separate opposite ends of the secondary power busway comprises coupling each bus duct of the at least two bus ducts to separate feed boxes at opposite ends of the secondary power busway via switch-supported electrical connections; and
the method comprises selectively switching the secondary power busway between receiving electrical power from separate bus ducts of the at least two bus ducts, based at least in part upon an open-transition switching of switching devices included in the switch-supported electrical connections.

20. The method of claim 14, wherein
configuring a secondary power busway to extend along a length of an aisle space that includes a row of electrical loads comprises configuring each secondary power busway of a plurality of secondary power busways to extend along a length of a separate aisle space of a plurality of parallel aisle spaces, from one side of an enclosure to another side of the enclosure, wherein each parallel aisle space includes a separate portion of the electrical loads; and
configuring at least two bus ducts to each couple to separate opposite ends of the secondary power busway comprises configuring the at least two bus ducts to extend, in parallel with each other, along separate sides of the enclosure which are proximate to separate ends of each of the plurality of parallel aisle spaces.

\* \* \* \* \*